United States Patent
Sheperek et al.

(10) Patent No.: US 11,442,641 B2
(45) Date of Patent: Sep. 13, 2022

(54) VOLTAGE BASED COMBINING OF BLOCK FAMILIES FOR MEMORY DEVICES

(71) Applicant: Micron Technology, Inc., Boise, ID (US)

(72) Inventors: Michael Sheperek, Longmont, CO (US); Kishore Kumar Muchherla, Fremont, CA (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/098,861

(22) Filed: Nov. 16, 2020

(65) Prior Publication Data
US 2022/0155955 A1  May 19, 2022

(51) Int. Cl.
*G06F 3/06* (2006.01)

(52) U.S. Cl.
CPC ............ *G06F 3/064* (2013.01); *G06F 3/0604* (2013.01); *G06F 3/0679* (2013.01)

(58) Field of Classification Search
CPC ....... G06F 3/064; G06F 3/0604; G06F 3/0679
See application file for complete search history.

(56) References Cited

U.S. PATENT DOCUMENTS

| 2013/0061101 | A1  | 3/2013 | Fitzpatrick et al. |
| 2018/0196749 | A1* | 7/2018 | Koo ............... G06F 12/0246 |
| 2021/0191617 | A1* | 6/2021 | Sheperek ............ G11C 29/021 |
| 2022/0066930 | A1* | 3/2022 | Sheperek ............ G11C 11/5642 |

OTHER PUBLICATIONS

EP Extended Search Report for EP Application No. EP21208603, dated Apr. 12, 2022, 10 pages.

* cited by examiner

*Primary Examiner* — Francisco A Grullon
(74) *Attorney, Agent, or Firm* — Lowenstein Sandler LLP

(57) ABSTRACT

An example memory sub-system includes a memory device and a processing device, operatively coupled to the memory device. The processing device is configured to create a first block family comprising a first set of blocks that have been programmed within at least one of a first specified time window or a first specified temperature window, wherein each block associated with the first block family is associated with a first set of read level offsets; create, a second block family comprising a second set of blocks that have been programmed within at least one of a second specified time window following the first specified time window or a second specified temperature window, wherein each block associated with the second block family is associated with a second set of read level offsets; and responsive to a determining that a threshold criterion is satisfied, combine the first and second block family.

20 Claims, 15 Drawing Sheets

Voltage Boundary Table 310

| Bin | Boundary |
|-----|----------|
| 0 | < V1 |
| 1 | < V2 |
| 2 | < V3 |
| 3 | < V4 |
| 4 | < V5 |
| 5 | < V6 |
| 6 | < V7 |
| 7 | >= V7 |

Voltage Offset Table 320

Voltage Offsets

Voltage Bin for TAP=0 hours 322

Voltage Bin for TAP=T hours 324

| Level\Bin | Bin 0 | Bin 1 | Bin 2 | Bin 3 | Bin 4 | Bin 5 | Bin 6 | Bin 7 |
|---|---|---|---|---|---|---|---|---|
| L1 | V10 | V11 | V12 | V13 | V14 | V15 | V16 | V17 |
| L2 | V20 | V21 | V22 | V23 | V24 | V25 | V26 | V27 |
| L3 | V30 | V31 | V32 | V33 | V34 | V35 | V36 | V37 |
| L4 | V40 | V41 | V42 | V43 | V44 | V45 | V46 | V47 |
| L5 | V50 | V51 | V52 | V53 | V54 | V55 | V56 | V57 |
| L6 | V60 | V61 | V62 | V63 | V64 | V65 | V66 | V67 |
| L7 | V60 | V61 | V62 | V63 | V64 | V65 | V66 | V67 |

FIG. 3

| | Die 0 | Die 1 | Die 2 | Die 3 |
|---|---|---|---|---|
| BFn 1010 | 25.1 | 25.3 | 24.9 | 24.0 |
| BFm 1020 | 25.0 | 25.5 | 25.0 | 24.4 |

FIG. 10

| Block Family Index | Die 0 Write Temp | Die 1 Write Temp | ... | Die N Write Temp | Die 0 Read Temp | Die 1 Read Temp | ... | Die N Read Temp |
|---|---|---|---|---|---|---|---|---|
| 1 | 80°C | 77°C | | 78°C | 50°C | 45°C | | 48°C |
| 2 | | | | | | | | |
| 3 | | | | | | | | |
| 4 | | | | | | | | |
| 5 | | | | | | | | |
| 6 | | | | | | | | |
| 7 | | | | | | | | |
| ... | ... | ... | | ... | ... | ... | | ... |
| 64 | | | | | | | | |

Family Table 1100

FIG. 11

VOLTAGE BASED COMBINING OF BLOCK FAMILIES FOR MEMORY DEVICES

TECHNICAL FIELD

Embodiments of the disclosure are generally related to memory sub-systems, and more specifically, are related to voltage based combining of block families for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3 depicts an example voltage boundary table and an example voltage offset table.

FIG. 10 schematically illustrates an example of combining block families based on a voltage metric of each die in the block families.

FIG. 11 schematically illustrates example metadata maintained by the memory sub-system controller for associating block families with die temperatures.

DETAILED DESCRIPTION

Figure 1:
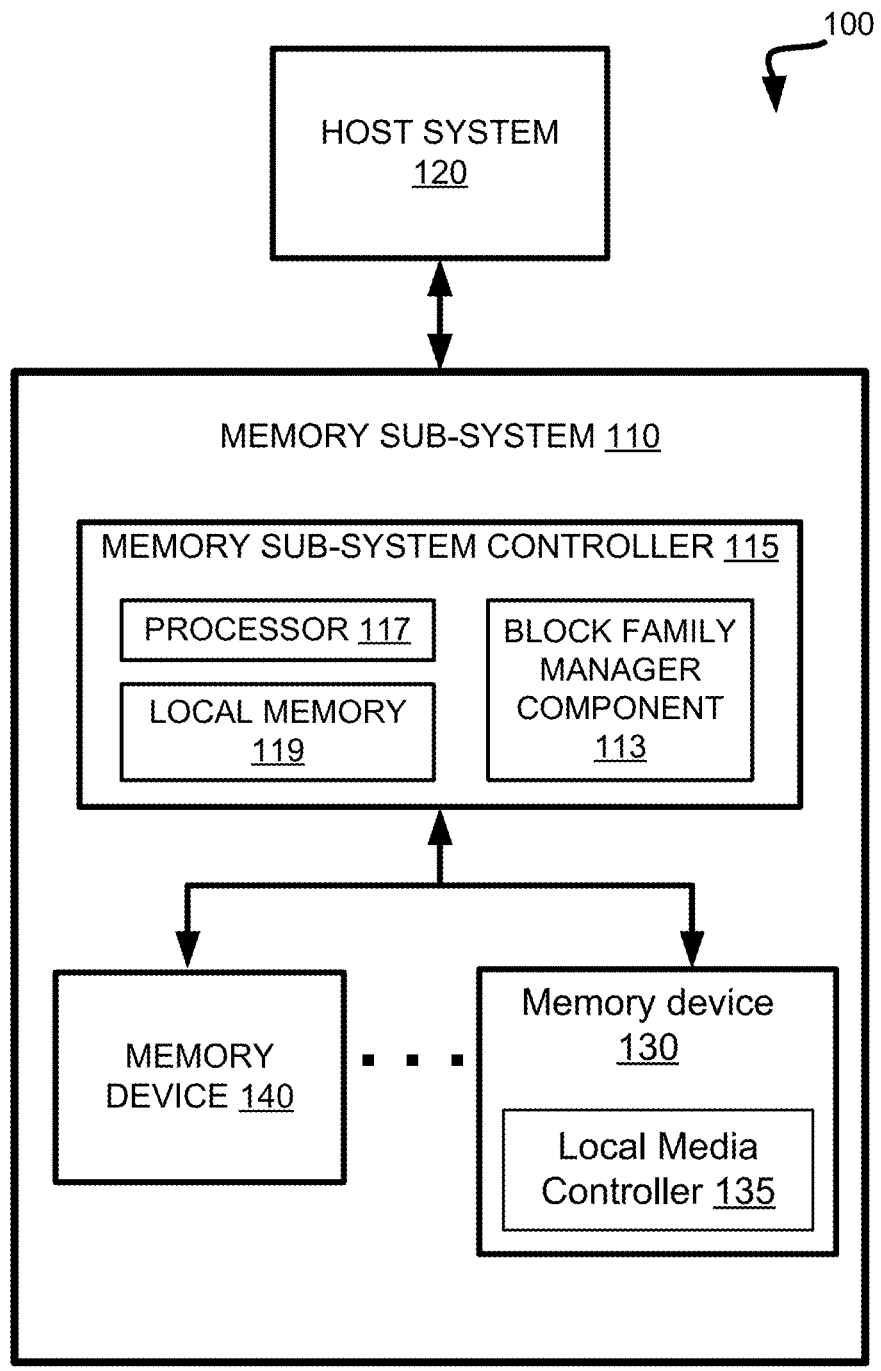
FIG. 1 illustrates an example computing system that includes a memory sub-system in accordance with some embodiments of the present disclosure.

Embodiments of the present disclosure are directed to voltage based combining of block families for memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dies. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage offset bins, which is in turn associated with the voltage offset to be applied for read operations. The associations of blocks with block families and block families and dies with threshold voltage offset bins can be stored in respective metadata tables maintained by the memory sub-system controller.

Upon receiving a read command, the memory sub-system controller can identify the block family associated with the block identified by the logical block address (LBA) specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage, as described in more detail herein below.

As block families age, the temporal voltage shifts for temporally adjacent block families (e.g., block families that are adjacent in the block family creation order) can converge. Since the metadata tables maintained by the memory sub-system controller can have a finite amount of space to store records associated with different block families, it can be desirable to combine multiple active block families into a single block family. In some embodiments, the memory sub-system controller can perform a combining operation by updating a block family metadata table. For example, a metadata table entry relating to block family metadata associated with a first block family can be updated to also include records of blocks associated with a second block family. Records associated with the second block family in the block family metadata table can then be cleared and the second block family can be reused during a future write operation. To determine whether to combine two block families, the memory sub-system controller can determine whether the difference in the voltage offset value (measured by a voltage metric) associated with the two block families satisfies a threshold condition. For example, the threshold criterion can be satisfied when the difference of the voltage offset values of the two block families is less than a predetermined threshold value. By combining the two block families, space is freed in the block family metadata table, and less block families need to be tracked and periodically calibrated.

Therefore, advantages of the systems and methods implemented in accordance with some embodiments of the present disclosure include, but are not limited to, utilizing less metadata to improve performance and energy consumption, and decreasing resources allocated to periodic calibration.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager component 113 that can be used to implement the block family-based error avoidance strategies in accordance with embodiments of the present disclosure. In some embodiments, the controller 115 includes at least a portion of the block family manager component 113. For example, the controller 115 can include a processor 117 (processing device) configured to execute instructions stored in local memory 119 for performing the operations described herein. In some embodiments, the block family manager component 113 is part of the host system 120, an application, or an operating system. The block family manager component 113 can manage block families associated with the memory devices 130, as described in more detail herein below.

Figure 2:
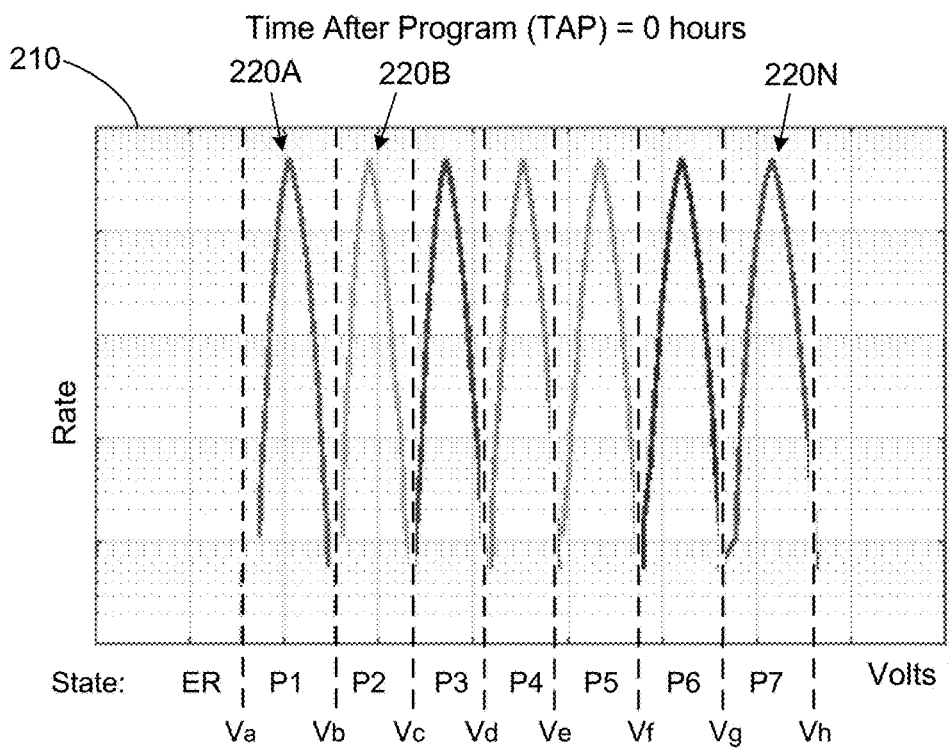
FIG. 2 schematically illustrates the temporal voltage shift caused by the slow charge loss exhibited by triple-level memory cells, in accordance with some embodiments of the present disclosure.
Figure 2:
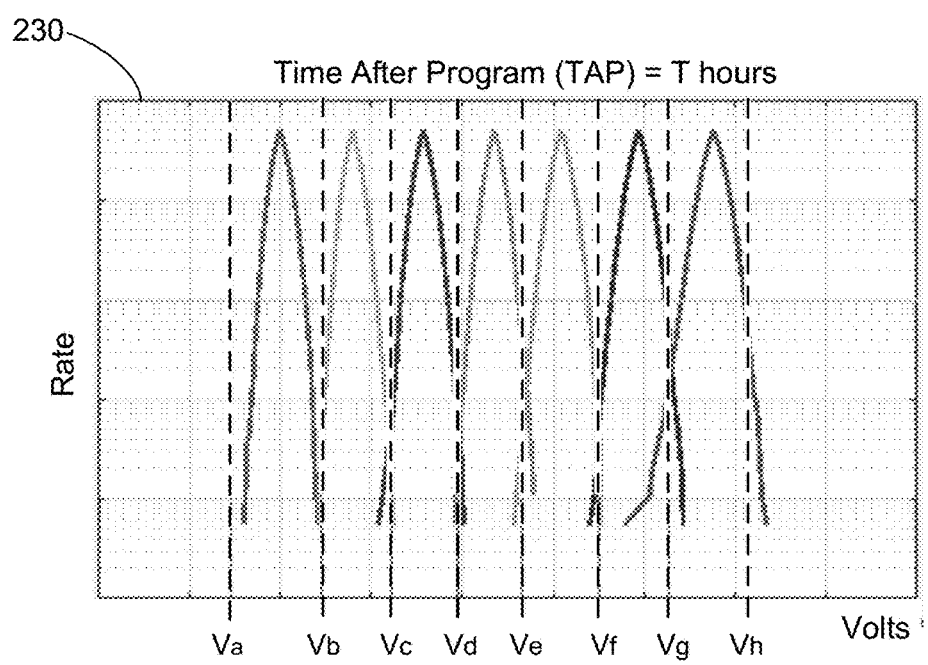

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-220N (also referred to as "program distributions" or "voltage distributions" or "distributions" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

FIG. 3 depicts an example voltage boundary table and an example voltage offset table. The voltage boundary table 310 and the voltage offset table 320 can be used to determine read level offsets, which are added to a base read level voltage to read data from memory cells. As the time after program increases, the threshold voltages for the distribution of the memory cell can change as a result of storage charge loss, as illustrated in the example of FIG. 2. To determine the appropriate read level offset for reading a cell, a measurement of the cell can be performed to estimate the time after program of the cell based on data state metrics such as voltages. For example, the level 7 distribution of the cell can be measured, and the difference between the measured read level (e.g., 100 millivolts) and a reference read level (e.g., 0 volts) can be determined. The difference corresponds to the time after program of the memory cell, and can be used to identify a read level offset to add to the base read threshold level to perform read operations.

The voltage boundary table 310 can be used to identify a bin that contains read offsets for use in reading data from the memory cell. The bin to be used is the value of the Bin column for which the voltage difference (between the measured read level and the reference read level) corresponds to a voltage range shown in the Boundaries column. For example, if the difference is less than V1, then bin 0 is to be used. If the difference is between V1 and V2, then bin 1 is to be used, and so on. The voltage offsets table can be used to identify the read level offsets to be used for the identified bin. For example, if the bin to be used is bin 0, then the corresponding one of the offsets shown in the column labeled "Bin 0" 322 (e.g., V10, V20, . . . V60) is to be added to the base read offset level (and any other offsets) for each of levels 1-7 when reading the memory cell. "Bin 0" 322 corresponds to the time after program of 0 hours shown in FIG. 2. A column "Bin 5" 324 corresponds to the time after program of T hours shown in FIG. 2, and has offsets of greater magnitude. Bin numbers less than a threshold age value can be referred to as "younger bins" and bin numbers greater than or equal to the threshold age value can be referred to as "older bins." For example, if the threshold age value is the bin number 5, then bins 0-4 can be referred to as younger bins, and bins 5-7 can be referred to as older bins. As another example, if the threshold age value is the bin number 4, then bins 0-3 can be referred to as younger bins, and bins 4-7 can be referred to as older bins.

As described above, "read level" herein shall refer to a voltage position. Read levels are numbered in increasing voltage from L1 through 2^ (number of bits). As an example, for TLC, the read levels would be L1, L2, . . . , L7. "Read level value" herein shall refer to a voltage or DAC value representing a voltage that that is applied to the read element (often, the control gate for a NAND cell) for purposes of reading that cell. "Read level offset" herein shall refer to a component of the equation that determines the read level value. Offsets can be summed (i.e., read level value=offset_a+offset_b+ . . . ). By convention, one of the read level offsets can be called the read level base. "Calibration" herein shall refer to altering a read level value (possibly by adjusting a read level offset or read level base) to better match the ideal read levels for a read or set of reads.

As described above, "bin" (or "voltage bin" or "voltage offset bin") herein shall refer to a set of read level offsets that are applied to a set of data. The bin offsets are read level offsets that affect the read level for block families within the bin. In this context, a bin is usually primarily directed at addressing TVS, but can also be directed at other mechanisms (e.g., temperature coefficient (tempco) miscalibration). An old or older bin is one where the read level offsets are directed at data that was written at a relatively early time. A young or younger bin is one where the read level offsets are directed at data written relatively recently. The read level adjustments can be implemented through either offsets or read retries, or even as an adjustment to the base. Bin selection herein shall refer to the process by which the memory device selects which bin to use for a given read.

Figure 4A:
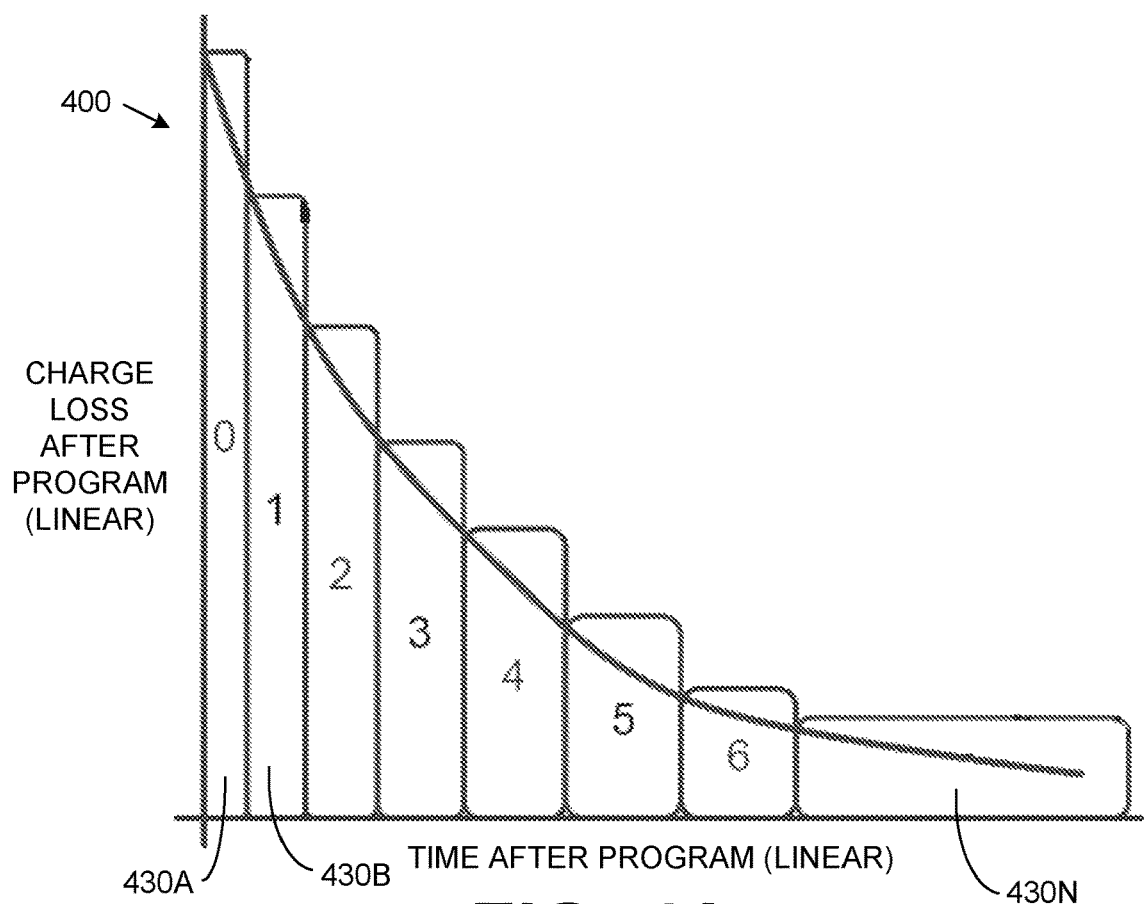
FIG. 4A depicts an example graph illustrating the dependency of the threshold voltage offset on the time after program (i.e., the period of time elapsed since the block has been programmed, in accordance with some embodiments of the present disclosure.

FIG. 4A depicts an example graph 400 illustrating the dependency of the threshold voltage offset on the time after program (i.e., the period of time elapsed since the block has been programmed, in accordance with some embodiments of the present disclosure. As schematically illustrated by FIG. 4A, blocks families of the memory device are grouped into bins 430A-430N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family—are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family. The memory sub-system controller can maintain an identifier of the active block family, which is associated with one or more blocks as they are being programmed.

A newly created block family can be associated with bin 0. Then, the memory sub-system controller can periodically perform a calibration process in order to associate each die of every block family with one of the predefined voltage bins (bins 0-7 in the illustrative example of FIG. 4A), which is in turn associated with the voltage offset to be applied for read operations. The associations of blocks with block families and block families and dice with voltage bins can be stored in respective metadata tables maintained by the memory sub-system controller, such as metadata tables described with respect to FIG. 7 below.

Figure 4B:
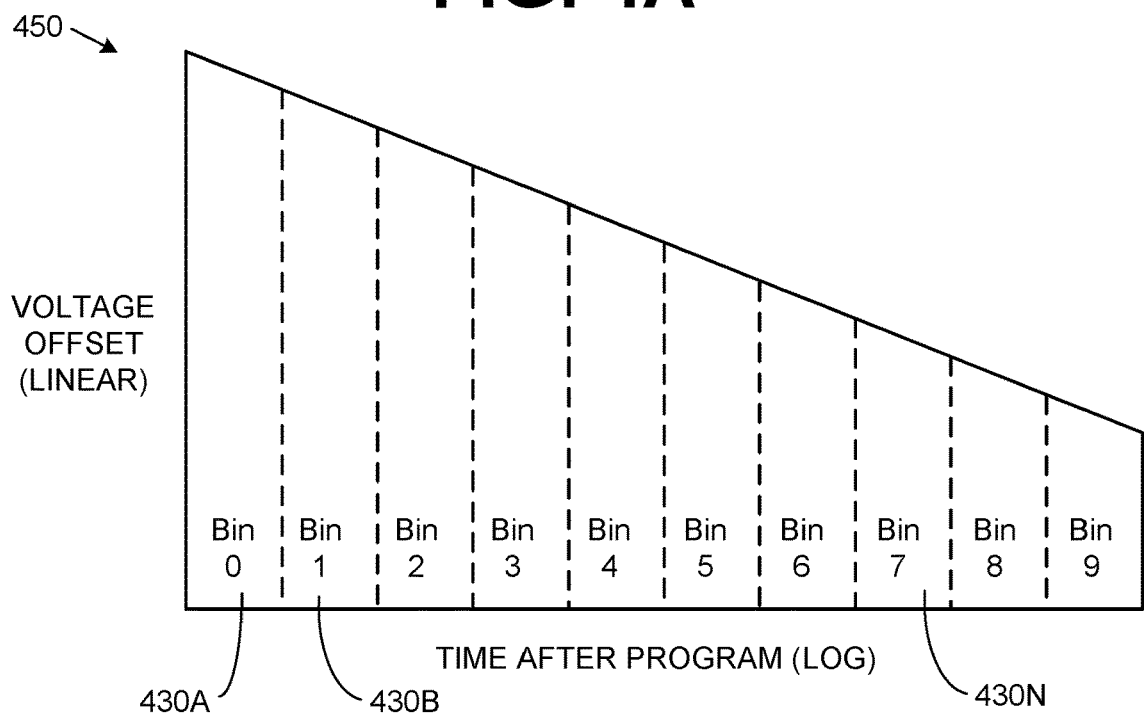
FIG. 4B schematically illustrates a set of predefined voltage bins, in accordance with embodiments of the present disclosure.

FIG. 4B schematically illustrates a set of predefined threshold voltage bins, in accordance with embodiments of the present disclosure. As schematically illustrated by FIG. 4B, the threshold voltage offset graph 450 can be subdivided into multiple voltage bins, such that each voltage bin corresponds to a predetermined range of threshold voltage offsets. While the illustrative example of FIG. 4B defines ten voltage bins, in other implementations, various other numbers of voltage bins can be employed (e.g., 64 bins). The memory sub-system controller can associate each die of every block family with a voltage bin, based on a periodically performed calibration process, described in further detail below.

Figure 5:
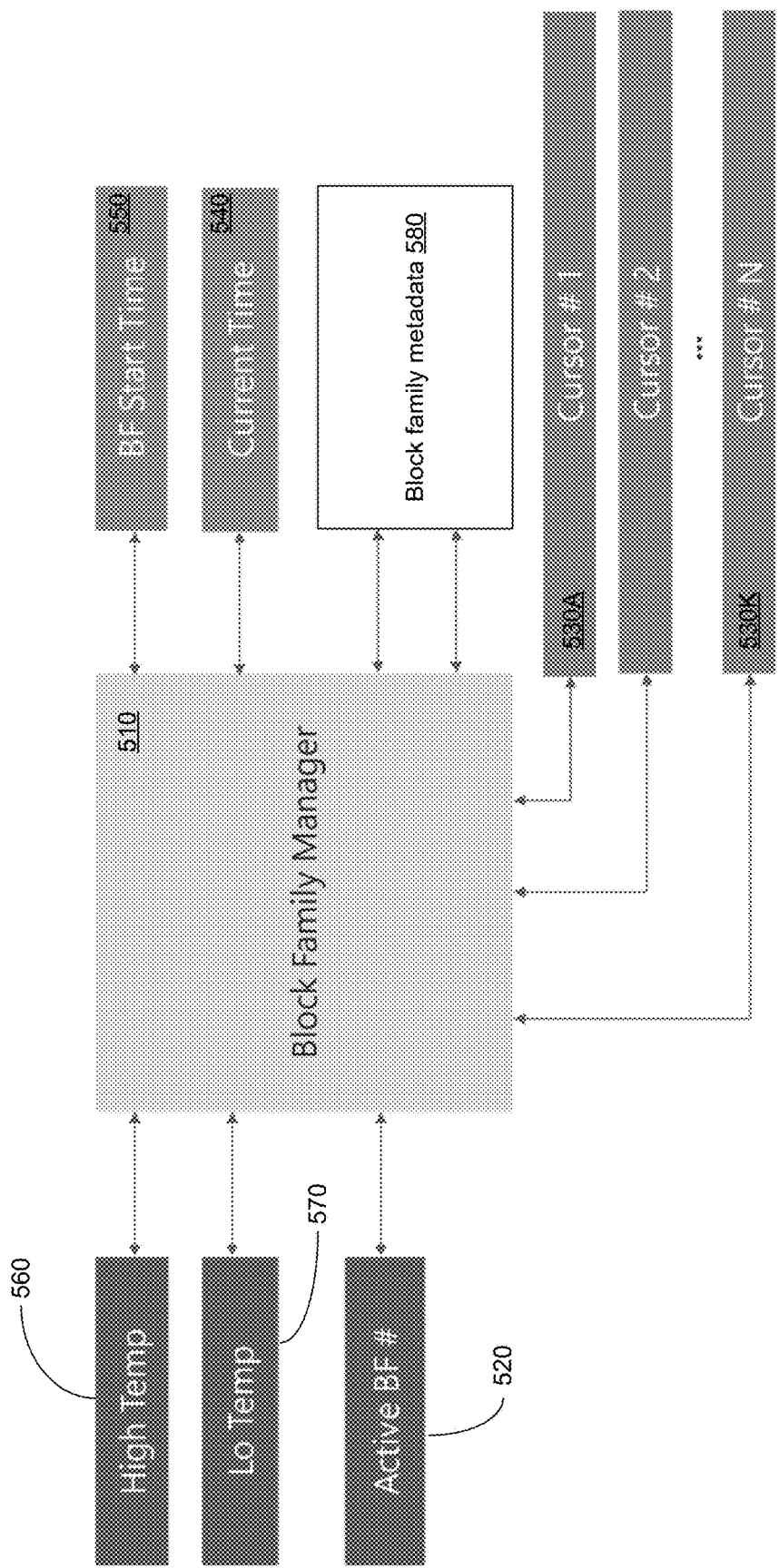
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each die of every block family with a threshold voltage offset bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation.

Figure 6:
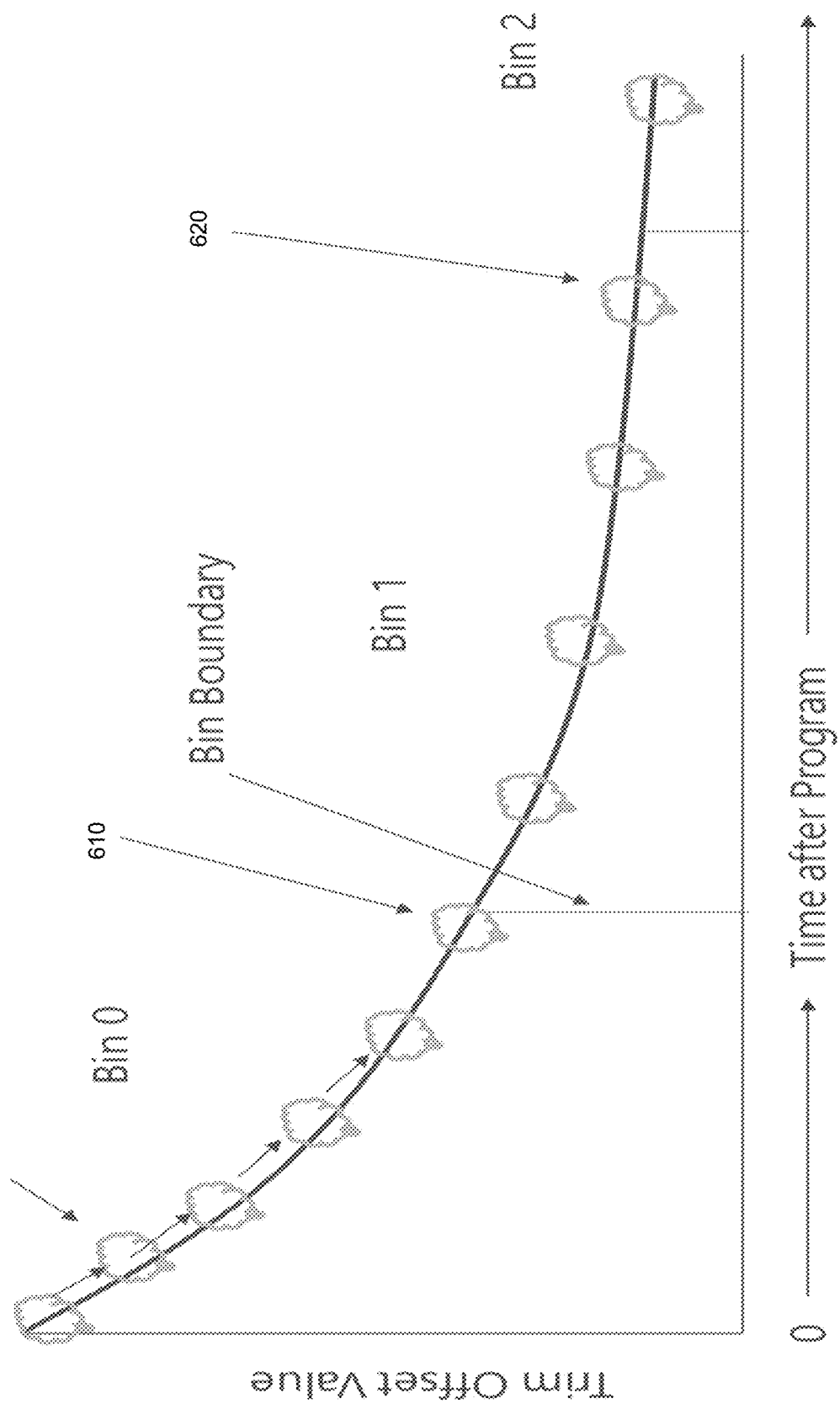
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin 0 and block family 620 in bin 1), since it is the oldest block family that will, due to the slow charge loss, migrate to the next bin before any other block family of the current bin.

Figure 7:
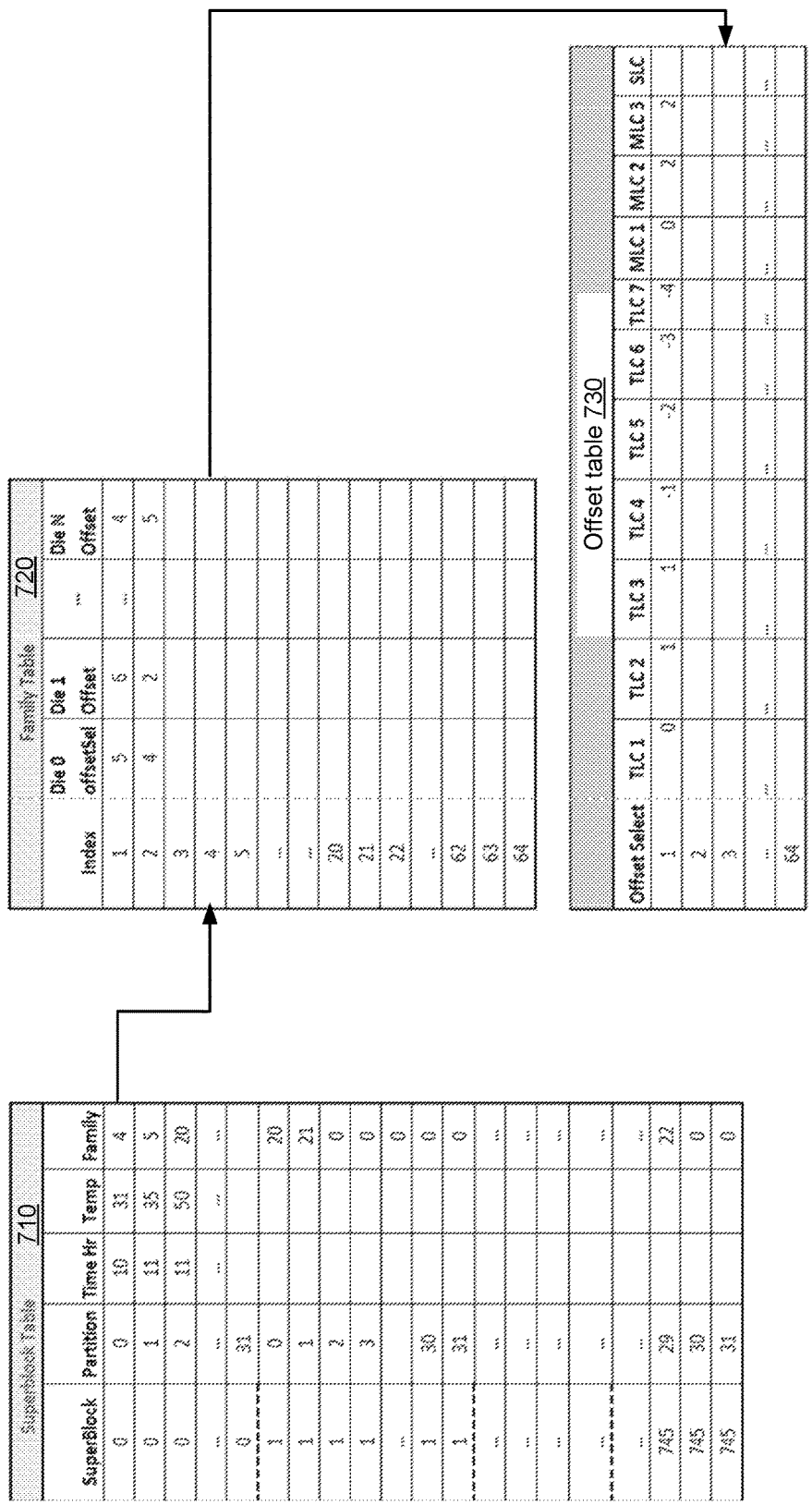
FIG. 7 schematically illustrates example metadata maintained by the memory sub-system controller for associating blocks and/or partitions with block families, in accordance with embodiments of the present disclosure.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage offset bins associated with respective dies of the block family. In other words, each record of the family table 720 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 730 is indexed by the bin number. Each record of the offset table 730 specifies a set of threshold voltage offsets (e.g., for TLC, MLC, and/or SLC) associated with threshold voltage offset bin.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage offset bin associated with the block family and the die; finally, the identified threshold voltage offset bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 3. The latter value is used as the index to the offset table in order to determine the threshold voltage offset values for bin 3.

Figure 8:
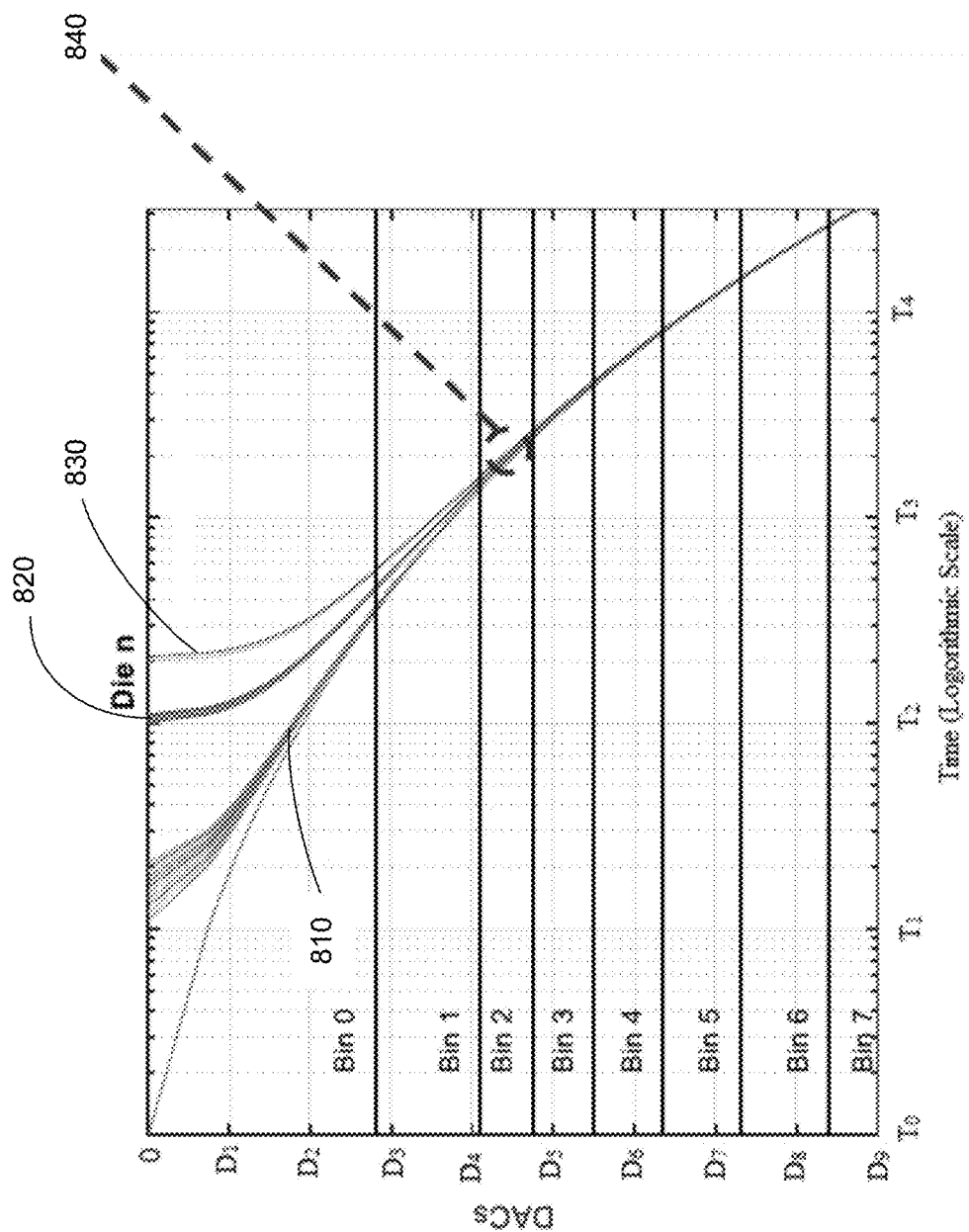
FIG. 8 graph illustrating a temporal voltage shift of dies of multiple block families converging to a similar value.

FIG. 8 is a graph illustrating a temporal voltage shift of dies of multiple block families converging to a similar value, in accordance with embodiments of the present disclosure. As illustrated by FIG. 8, the memory sub-system controller created multiple block families (block family 810, block family 820, and block family 830) over time (represented logarithmically by the bottom x-axis). Each die (represented by a sloping line originating from the top x-axis) of each block family 810, 820, 830 is associated with threshold voltage offset bin 0 upon the creation of a block family. The y-axis represents the voltage offset for each bin. The voltage offset is represented in DAC (digital-to-analog converter) units (e.g., a DAC value), where one DAC value is equivalent to 10 millibels.

As the data in each block family 810, 820, 830 ages, the voltage offset increases for each die of each block family 810, 820, 830. A periodical calibration process performed by the memory sub-system controller 115 determines whether to associate each die of the block families 810, 820, 830 with a new threshold voltage offset bin. As seen in FIG. 8, as time progresses, the voltage offset of the dies of the block families 810, 820, 830 can converge (as shown at 840) to a similar value. To reduce the number of calibration operations needed to be performed, the memory sub-system controller 115 can combine two block families into a single block family, based on certain conditions, by updating the metadata tables maintained by the memory sub-system controller 115. In an illustrative example, a first block family can include blocks 1-100 (spanning across one or more dies) and a second block family can include blocks 101-200 (spanning across one or more dies). The second block family can be combined into the first block family, such that the first block family includes blocks 1-200, by updating the superblock table 710 and the family table 720 in the illustrative example of FIG. 7. For example, the second block family can be unmapped from the superblock table 710 and from the family table 720, and the first block family can be update in a metadata table (not shown) to be associated with blocks 1-200. Each die associated with blocks 1-200 can be associated with an appropriate bin (e.g., in family table 720). As such, by combining two block families, space is freed in the block family table, and the second block family record is recycled for future use.

Figure 9:
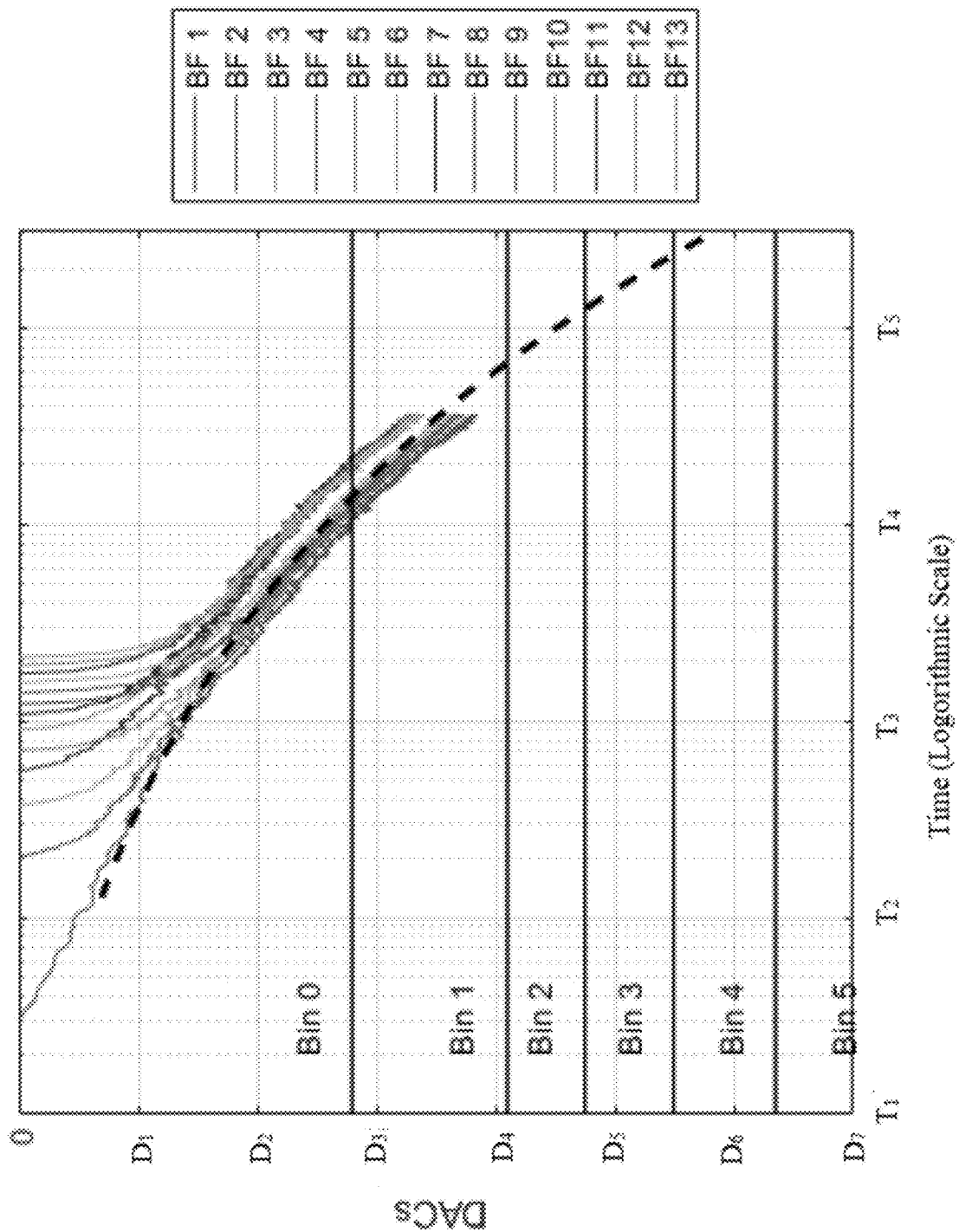
FIG. 9 is a graph illustrating a temporal voltage shift of multiple block families converging to a similar value.

FIG. 9 is a graph illustrating the temporal voltage shift of multiple block families converging, in accordance with these embodiments of the present disclosure. Multiple block families 1-13 (represented by a sloping line originating from the top x-axis and having a sequential order from left to right) are created over time (represented logarithmically by the bottom x-axis). Each die (not shown) of each block family is associated with threshold voltage offset bin 0 upon the creation of the block family. The y-axis represents the voltage offset for each bin. In an example, despite the fact that blocks span over multiple dies, any given block family can be dies assigned to a single bin based on a chosen criterion (e.g., based on a die in the block family with the largest temporal voltage shift, a die with the smallest temporal voltage shift, an average of the temporal voltage shifts of all the dies in the block family, etc.).

In some embodiments, the memory sub-system controller 115 can combine two block families based on a data state metric. The data state metric is a numeric value that is inferred from the behavior of data within the memory sub-system 110 and reflects the temporal voltage shift, the degree of read disturb, the bin to which the data should be assigned, etc. For example, the memory sub-system controller 115 can first select a pair of temporally adjacent block families (e.g., block families that are adjacent in the block family creation order, such that the second block family of the pair of block families was created immediately after closing the first block family of the pair of block families), e.g., block family 13 and block family 12 shown in FIG. 9. The memory sub-system controller 115 can select the first candidate block family as the oldest (e.g., the least recently created) block family in the block family creation order (e.g., block family 13), the youngest (e.g., the most recently created) block family in the block family creation order (e.g., block family 1), the oldest or youngest block family associated with a predetermined bin (e.g., oldest or youngest block family associated with bin 2), a random block family, etc. Responsive to selecting the first candidate block family, the memory sub-system controller 115 can then inspect its temporally adjacent block family to determine whether the difference in the data state metric between the two block families satisfies a threshold criterion.

In an example, the data state metric can be a voltage metric that indicates the measure of the temporal voltage shift (e.g., voltage offset). The voltage metric can be measured in DAC (digital-to-analog converter) units, millibels, or volts. The threshold criterion can be satisfied when, for example, the difference in the voltage metric associated with a chosen die of one block family and the same die of another block family is below a predefined voltage threshold value for all dies of the memory sub-system 110. This will be explained in further detail in FIG. 10. If the threshold criterion is satisfied, the memory sub-system controller 115 can combine the two block families. If the threshold criterion is not satisfied, memory sub-system controller 115 can scan for another pair of block families to combine. For example, if the youngest block family in the block family creation order was selected as the first candidate block family, the memory sub-system controller 115 then select the second youngest block family (and so on) in the block family creation order and a temporality adjacent block family to the second youngest block family as additional candidates for combining.

In another example, the data state metric can be a bin placement metric that indicates the difference in the bin placement of a chosen die of one block family and the same die of another block family. The threshold criterion can be satisfied if, for example, a difference in a bin placement metric is below a bin threshold value for all dies of the memory sub-system 110. In an illustrative example, the memory sub-system controller 115 can select two rows (e.g., index 1 and 2) in the block family table 720 of FIG. 7, determine the difference for each bin associated with each die in index 1 to each bin of the same die in index 2 (e.g., for die 0,|5−4|=1; for die 1,|6−2|=4; for die n, |4−5|=1), select a maximum difference value (e.g., 4), and compare the maximum difference value to the bin threshold value. If the maximum difference value is less than the bin threshold value, the memory sub-system controller 115 can combine the two block families.

In another illustrative example, the temporal voltage shift of the first candidate block family can have a DAC value of 16, the temporal voltage shift of the second candidate block family can have DAC value of 17, and the threshold value can be a DAC value of 2. Accordingly, the memory sub-system controller 115 can combine the first candidate block family and the second candidate block family since the difference in the voltage metric value of 1 (2−1=1) is less than the threshold value of 2.

FIG. 10 schematically illustrates an example of combining block families based on per die voltage metric values, in accordance with embodiments of the present disclosure. As schematically illustrated by FIG. 10, the memory sub-system controller 115 can select the first candidate block family (e.g., BFn 1010) and its temporally adjacent block family (e.g., BFm 1020) as the second candidate block family. The memory sub-system controller 115 can select the first candidate block family as the oldest block family in the block family creation order, the youngest block family in the block family creation order, the oldest or youngest block family in a predetermined bin (e.g., oldest or youngest block family in bin 2), a random block family, etc. Responsive to selecting the first candidate block family, the memory sub-system controller 115 can then inspect its temporally adjacent block family determine whether the difference in the voltage metric value between each die associated with the first candidate block family and the same die associated with the second candidate block family (e.g., each die is comparted with itself) satisfies a threshold criterion. The threshold criterion can be satisfied when, for example, the maximum difference in the voltage metric for each die comparison is less than the predefined voltage threshold value. Referring to FIG. 10 by way of example, where the predefined voltage threshold value is 0.5 DACs, the voltage difference in die 0 between the first candidate block family and the second candidate block family is 0.1 DACs, the voltage difference in die 1 between the first candidate block family and the second candidate block family is 0.2 DACs, the voltage difference in die 2 between the first candidate block family and the second candidate block family is 0.1 DACs, and the voltage difference in die 3 between the first candidate block family and the second candidate block family is 0.4 DACs. Thus, the maximum difference in the voltage metric of each die comparison is 0.4 DACs. Accordingly, memory sub-system controller 115 can combine the first candidate block family and the second candidate block family since the maximum difference in the voltage metric value for each die comparison (0.4 DACs) is less than the predefined voltage threshold value of 0.5 DACs. Measurements relating to the voltage metric (or any data state metric) for each die comparison be stored in a temporary memory structure, and cleared once the process of determining whether to combine the first candidate block family and the second candidate block family is complete.

FIG. 11 schematically illustrates example metadata maintained by the memory sub-system controller for associating block families with die temperatures, in accordance with embodiments of the present disclosure. As schematically illustrated by FIG. 11, the memory sub-system controller 115 can maintain family table 1110.

The memory sub-system controller 115 can combine two block families based on write temperatures and/or read temperatures. The write temperature can be the temperature measured at the memory device during a write operation, e.g., the maximum temperature across all dies of the memory device, the minimum temperature across all dies of the memory device, the median temperature across all dies of the memory device, etc. The read temperature can be the temperature measured at the memory device during a read operation, e.g., the maximum temperature across all dies of the memory device, the minimum temperature across all dies of the memory device, the median temperature across all dies of the memory device, etc. By way of example, methods of combining block families based on write temperatures will be discussed. However, it is noted that such methods can be applied to combine block families based on read temperatures.

In some embodiments, the memory sub-system controller 115 can select a pair of temporally adjacent block families. The memory sub-system controller 115 can select the first candidate block family based on the oldest block family in the block family creation order, the youngest block family in the block family creation order, the oldest or youngest block family in a predetermined bin (e.g., oldest or youngest block family in bin 2), a random block family, etc. Responsive to selecting the first candidate block family, the memory sub-system controller 115 can then inspect its temporally adjacent block family (second block family candidate) to determine whether the difference in a write temperature value between each die associate with the first candidate block family and the same die of the second candidate block family (e.g., each die is compared with itself) satisfies a temperature threshold criterion. The temperature threshold criterion can be satisfied when, for example, the maximum difference in the write temperature value for each die is less than the predefined temperature threshold value.

In an illustrative example, the predefined temperature threshold value can be 5° C., the write temperature difference in the first die associated with the first candidate block family and the second candidate block family can be 3° C., and the write temperature difference in the second die associated with the first candidate block family and the second candidate block family can be 4° C. Thus, the maximum difference in the write temperature of each die comparison is 4° C. Accordingly, the memory sub-system controller 115 can combine the first candidate block family and the second candidate block family since the maximum difference in the write temperature for each die comparison (4° C.) is less than the predefined temperature threshold value of 5° C. The maximum difference in the write temperature value is used by way of example, and other criterion can be used, such as an average write temperature value of the die comparisons, a median write value of the die comparisons, etc.

In some embodiments, the memory sub-system controller 115 can combine two block families when the write temperature of each die falls within a write temperature threshold range. In an example, the write temperature threshold range can be 75° C.-80° C. The memory sub-system controller 115 can determine, via family table 1110, that the write temperatures of a first, second, and third die associated with the first candidate block family are 75° C., 77° C., and 78° C., respectively, and the write temperatures of the first, second, and third die associated with the candidate second block family are 76° C., 79° C., and 79° C., respectively. Accordingly, the memory sub-system controller 115 can combine the first candidate block family and the second candidate block family since the write temperature of each die associated with the two block families falls within the write temperature threshold range.

In some embodiments, the memory sub-system controller 115 can initiate combining block families responsive to a combining criterion threshold being satisfied. In an example, the combining criterion threshold can include the amount of extant (active) block families exceeding a predefined threshold value (e.g., 32). Combining block families can free locations in, for example, the family table metadata structure (e.g., family table 720). In some embodiments, the memory sub-system controller 115 can cease combining block families responsive to a cease combining criterion threshold being satisfied. In an example, the cease combining criterion threshold can include the amount of extant (active) block families being less than or equal to a predefined threshold value (e.g., 28).

In some embodiments, responsive to the memory sub-system controller 115 failing to detect combinable block families, the memory sub-system controller 115 modify the criterion for combining block families. In an example, the memory sub-system controller 115 can modify the predefined voltage threshold criterion by increasing the predefined voltage threshold value required to satisfy the voltage threshold criterion (e.g., from 0.5 DACs to 1.0 DACs). In another example, the memory sub-system controller 115 can modify the temperature threshold criterion by increasing the temperature threshold value required to satisfy the temperature threshold criterion (e.g., from 5° C. to 8° C.). In yet another example, the memory sub-system controller 115 can modify the temperature threshold criterion by increasing the write temperature threshold range required to satisfy the temperature threshold criterion (e.g., from 75° C.-80° C. to 73° C.-82° C.).

Figure 12:
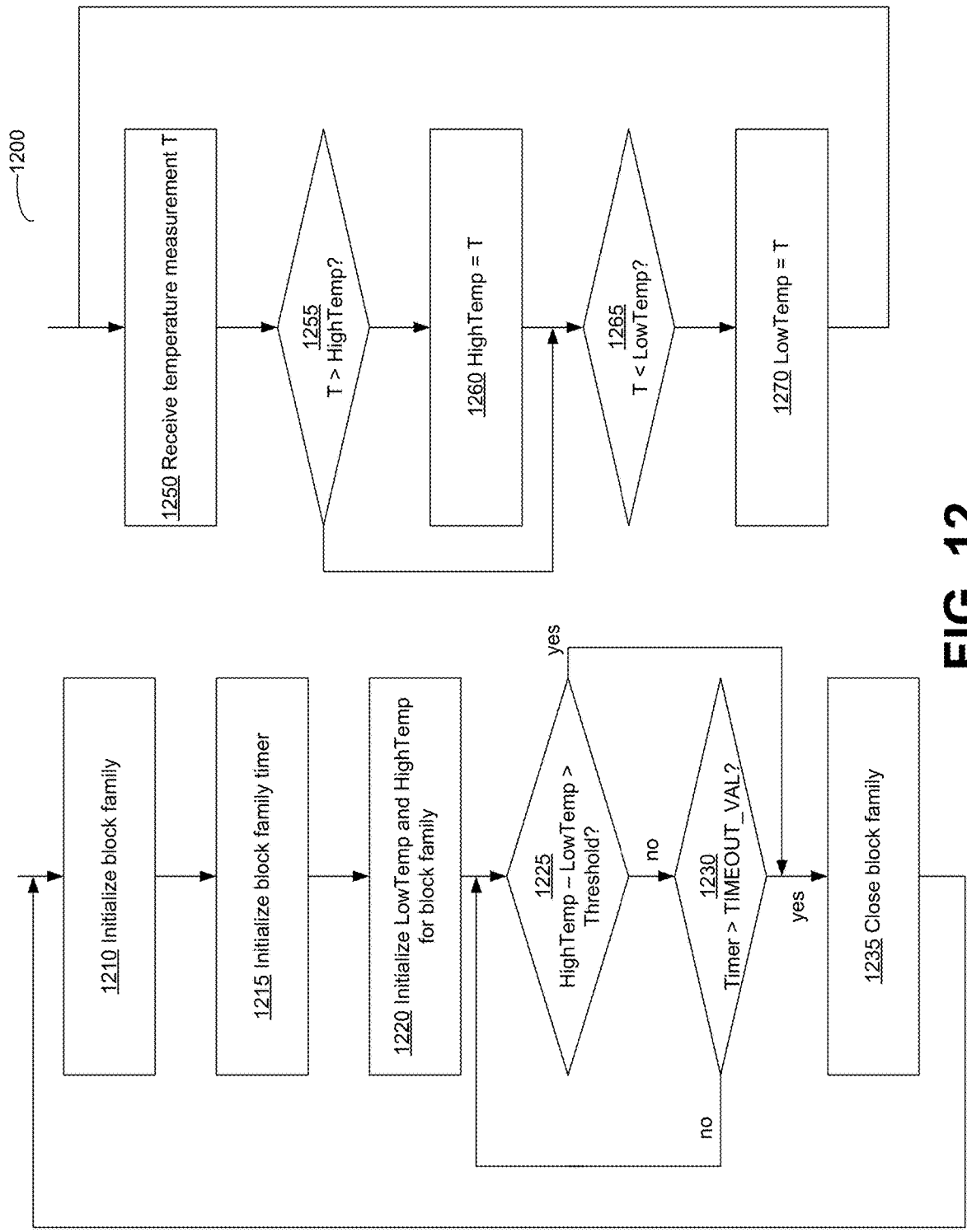
FIG. 12 is a flow diagram of an example method 1200 of block family management implemented by a memory sub-system controller operating in accordance with some embodiments of the present disclosure.

FIG. 12 is a flow diagram of an example method 1200 of block family management implemented by a memory sub-system controller operating in accordance with some embodiments of the present disclosure. The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1200 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1210, the processing logic of the memory sub-system controller initializes a block family and stores, in a memory variable, an identifier of the block family.

At operation 1215, the processing device initializes a timer associated with the block family.

At operation 1220, the processing logic initializes the low temperature and the high temperature associated with the block family to store the current temperature of a selected die of the memory device (e.g., a randomly selected die).

Responsive to determining, at operation 1225, that the difference between the high temperature and the low temperature values is greater than or equal to a specified temperature threshold value, the method branches to operation 1235; otherwise, the processing logic continues at operation 1230.

Responsive to determining, at operation 1230, that the value of the timer associated with the block family is greater than or equal to a specified timeout value, the processing logic may, at operation 1235, close the block family; otherwise, the method loops back to operation 1225.

Responsive to performing operation 1235, the method loops back to operation 1210.

Operations 1250-1270 are performed asynchronously with respect to operations 1210-1260. In an illustrative example, operations 1210-1235 are performed by a first processing thread, and operations 1250-1270 are performed by a second processing thread.

At operation 1250, the processing logic receives a temperature measurement at the selected die of the memory device.

Responsive to determining, at operation 1255, that the received temperature measurement is greater than or equal to the stored high temperature value, the processing logic, at operation 860, updates the high temperature value to store the received temperature measurement.

Responsive to determining, at operation 1265, that the received temperature measurement falls below the stored low temperature value, the processing logic, at operation 1270, updates the low temperature value to store the received temperature measurement.

Figure 13:
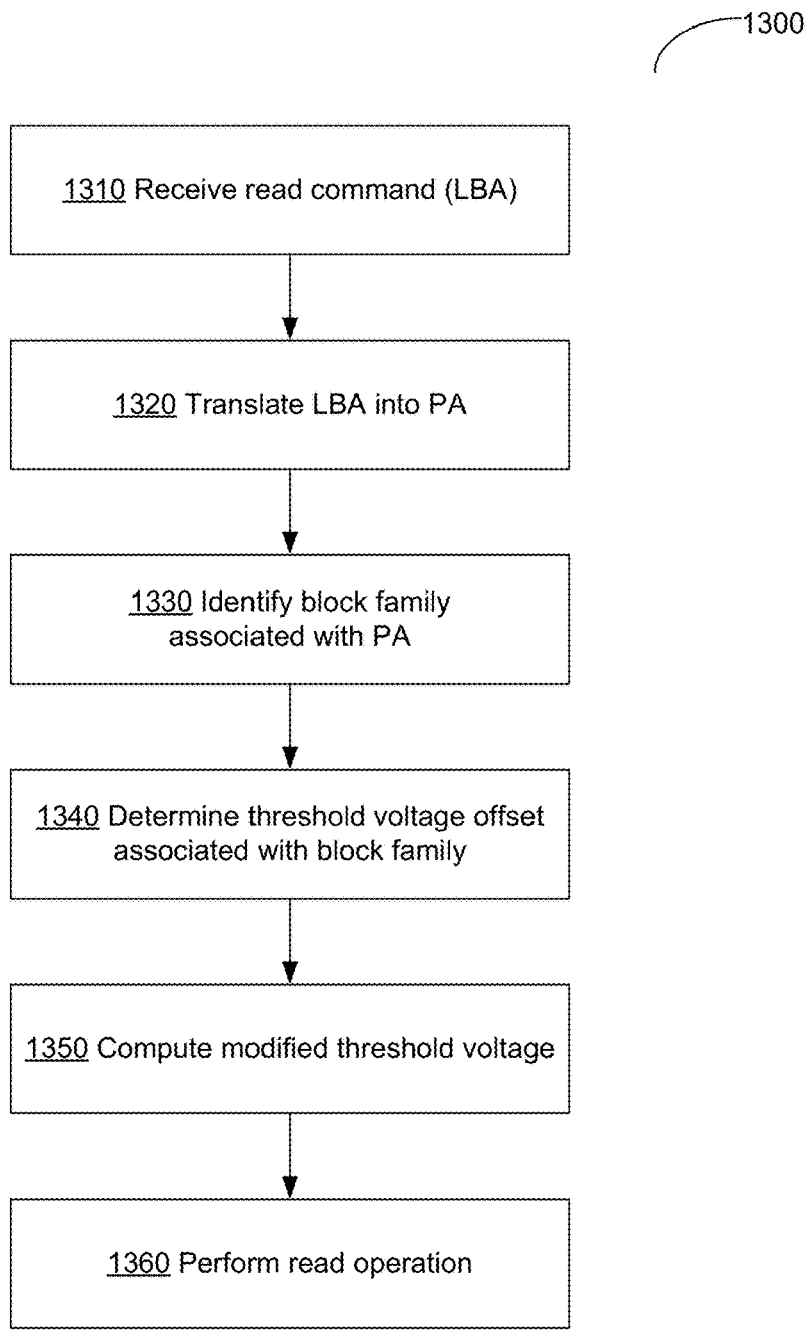
FIG. 13 is a flow diagram of an example method 1300 of performing a read operation by a memory sub-system controller operating in accordance with some embodiments of the present disclosure.

FIG. 13 is a flow diagram of an example method of performing a read operation by a memory sub-system controller operating in accordance with some embodiments of the present disclosure. The method 1300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1300 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1310, the processing logic of the memory sub-system controller receives a read command specifying an identifier of a logical block.

At operation 1320, the processing logic translates the identifier of the logical block into a physical address (PA) of a physical block stored on the memory device. In an illustrative example, the translation is performed by looking up the logical block identifier (also referred to as logical block address, or LBA) in a logical-to-physical (L2P) table associated with the memory device. The L2P table includes multiple mapping records, such that each mapping record maps an LBA to a corresponding physical address. For flash memory devices, the physical address can include channel identifier, die identifier, page identifier, plane identifier and/or frame identifier.

At operation 1330, the processing logic identifies, based on block family metadata associated with the memory device, a block family associated with the physical address. In an illustrative example, the processing device utilizes the superblock table 710 of FIG. 7 in order to identify the block family associated with the physical address.

At operation 1340, the processing logic determines a threshold voltage offset associated with the block family and the memory device die. In an illustrative example, the processing device utilizes the block family table 720 of FIG. 7, in order to determine the bin identifier corresponding to the combination of the block family identifier and the die identifier. The processing device then utilizes the offset table 730 of FIG. 7 in order to determine the threshold voltage offsets for the identified threshold voltage offset bin.

At operation 1350, the processing logic computes a modified threshold voltage by applying the identified threshold voltage offset to a base read level voltage associated with the memory device. As noted herein above, the base read level voltage can be stored in the metadata area of the memory device.

At operation 1360, the processing logic utilizes the computed modified threshold voltage in order to perform the requested read operation. Responsive to completing operation 1360, the method terminates.

Figure 14:
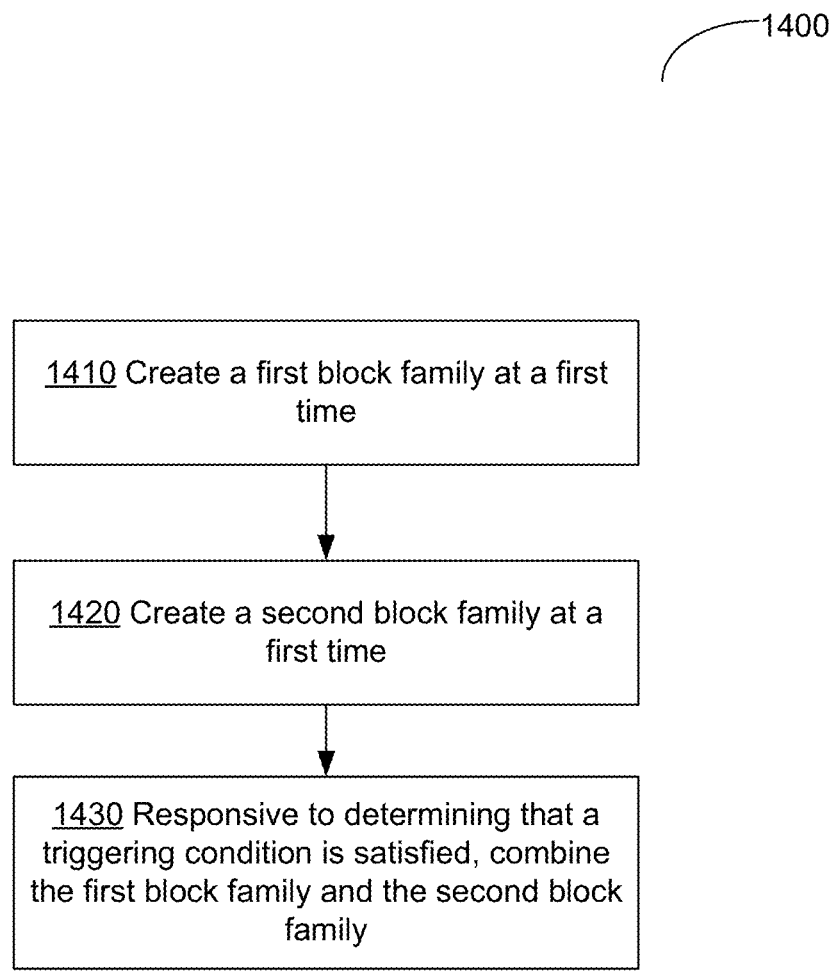
FIG. 14 is a flow diagram of an example method 1400 of block family combining implemented by a memory sub-system controller operating in accordance with some embodiments of the present disclosure.

FIG. 14 is a flow diagram of an example method 1400 of block family management implemented by a memory sub-system controller operating in accordance with some embodiments of the present disclosure. The method 1400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1400 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1410, the processing logic of the memory sub-system can create a first block family at a first time. The first block family can include a first set of blocks that have been programmed within a first specified time window and/or a first specified temperature window. Each block associated with the first block family can be associated with a first set of read level offsets.

At operation 1420, the processing logic can create a second block family at a second time. The second time can be following the first specified time window. The second block family can include a second set of blocks that have been programmed within a second specified time window and/or a second specified temperature window. Each block associated with the second block family can be associated with a second set of read level offsets.

At operation 1430, responsive to determining that a threshold criterion is satisfied, the processing logic can combine the first block family and the second block family. For example, the processing logic can appending to first block family metadata of the first block family a record associating blocks of the second block family. The processing logic can further remove a record associated with the second block family from a block family table. In some embodiments, the threshold criterion includes determining that the difference in a voltage offset value associated with each die of the first block family and the same die of the second block family satisfies a voltage threshold criterion. In some embodiments, the threshold criterion includes determining that the difference in a write temperature value associated with a die of the first block family and the same die of the second block family satisfies a write temperature threshold criterion for all dies of the memory device. In some embodiments, the threshold criterion includes determining that a write temperature value for each die associated with the first block family and the second block family are within a predetermined temperature range. In some embodiments, the threshold criterion includes determining that the difference in a voltage offset value associated with the first block family and the second block family satisfies a voltage threshold criterion. In some embodiments, the threshold criterion includes determining that a difference in a write temperature value associated with the first block family and the second block family satisfies a write temperature threshold criterion. In some embodiments, the threshold criterion includes determining that a write temperature value associated with the first block family and the second block family is within a predetermined temperature range.

In some embodiments, the processing logic can initiate combining block families responsive to a combining criterion threshold being satisfied. For example, combining the first block family and the second block family can be performed responsive to an amount of vacant records in a block family table being less than a threshold value. The processing logic can then cease combining block families responsive to a cease combining criterion threshold being satisfied. In an example, the cease combining criterion threshold can include an amount of vacant block families being greater than a threshold value.

The processing logic can begin a scan for combinable block families by selecting a youngest block family (e.g., a most recently created block family) in the block family creation order as a combining candidate. The processing logic can then select the second block family responsive to the second block family being adjacent to the first block family such that no other block family lies between the first block family and the second block family are in a block family creation order. Responsive to failing to detect two block families satisfying the threshold criterion, the processing logic can scan for another pair of block families to combine. For example, the processing logic can select the second youngest block family (and so on) in the block family creation order and a temporality adjacent block family to the second youngest block family as candidates for combining. In some embodiments, responsive to failing to detect two block families satisfying the threshold criterion, the processing logic can modify the threshold criterion. For example, the processing logic can modify the predefined voltage threshold criterion to allow for a greater chance of detecting two combinable block families.

Figure 15:
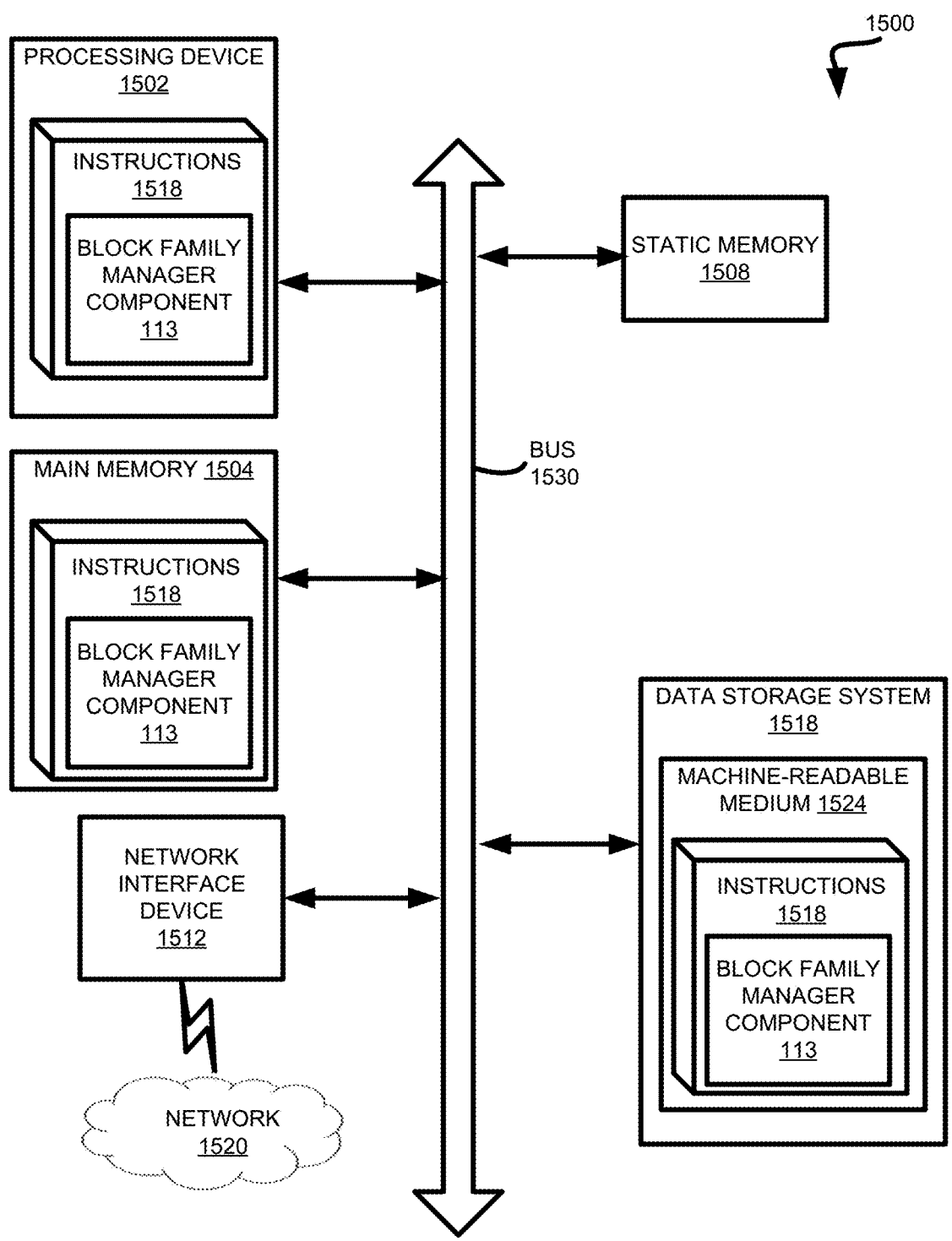
FIG. 15 is a block diagram of an example computer system in which embodiments of the present disclosure can operate.

FIG. 15 illustrates an example machine of a computer system 1500 within which a set of instructions, for causing the machine to perform any one or more of the methodologies discussed herein, can be executed. In some embodiments, the computer system 1500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM) or Rambus DRAM (RDRAM), etc.), a static memory 1510 (e.g., flash memory, static random access memory (SRAM), etc.), and a data storage system 1518, which communicate with each other via a bus 1530.

Processing device 1502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 can also be one or more special-purpose processing devices such as an application specific integrated circuit (ASIC), a field programmable gate array (FPGA), a digital signal processor (DSP), network processor, or the like. The processing device 1502 is configured to execute instructions 1528 for performing the operations and steps discussed herein. The computer system 1500 can further include a network interface device 1512 to communicate over the network 1520.

The data storage system 1518 can include a machine-readable storage medium 1524 (also known as a computer-readable medium) on which is stored one or more sets of instructions 1528 or software embodying any one or more of the methodologies or functions described herein. The instructions 1528 can also reside, completely or at least partially, within the main memory 1504 and/or within the processing device 1502 during execution thereof by the computer system 1500, the main memory 1504 and the processing device 1502 also constituting machine-readable storage media. The machine-readable storage medium 1524, data storage system 1518, and/or main memory 1504 can correspond to the memory sub-system 110 of FIG. 1.

In one embodiment, the instructions 1528 include instructions to implement functionality corresponding to the block family manager component 113 of FIG. 1. While the machine-readable storage medium 1524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
creating a first block family comprising a first set of blocks that have been programmed within at least one of a first specified time window or a first specified temperature window, wherein each block associated with the first block family is associated with a first set of voltage level offsets;
creating a second block family comprising a second set of blocks that have been programmed within at least one of a second specified time window following the first specified time window or a second specified temperature window, wherein each block associated with the second block family is associated with a second set of voltage level offsets; and
responsive to a determining that a threshold criterion is satisfied, combining the first block family and the second block family, wherein determining that the threshold criterion is satisfied comprises determining that a difference in a voltage offset value associated with a die of the first block family and the same die of the second block family is below a voltage difference threshold for all dice of the memory device.

2. The system of claim 1, wherein determining that the threshold criterion is satisfied further comprises:
determining that a difference in a write temperature value associated with a die of the first block family and the same die of the second block family satisfies a write temperature threshold criterion for all dies of the memory device.

3. The system of claim 1, wherein determining that the threshold criterion is satisfied further comprises:
determining that write temperature values associated with the first block family and the second block family are within a predetermined temperature range.

4. The system of claim 1, wherein combining the first block family and the second block family is performed responsive to determining that a number of vacant records in a block family table is below a threshold number.

5. The system of claim 1, wherein the second block family is created immediately after closing the first block family.

6. The system of claim 1, wherein the processing device is to further perform operations comprising:
removing a record associated with the second block family from a block family table.

7. The system of claim 1, wherein the processing device is to further perform operations comprising:
appending to first block family metadata of the first block family a record of the second set of blocks.

8. The system of claim 1, wherein the processing device is to further perform operations comprising:
selecting a most recently created block family among all block families and a second most recently created block family among all block families as combining candidates.

9. The system of claim 1, wherein the processing device is to further perform operations comprising:

responsive to failing to detect two block families satisfying the threshold criterion, modifying the threshold criterion.

10. A method comprising:
creating a first block family comprising a first set of blocks that have been programmed within a first specified time window, wherein each block associated with the first block family is associated with a first set of read level offsets;
creating a second block family comprising a second set of blocks that have been programmed within a second specified time window following the first specified time window, wherein each block associated with the second block family is associated with a second set of read level offsets; and
responsive to determining that a difference in a voltage offset value associated with a die of the first block family and the same die of the second block family is below a voltage difference threshold for all dies of the memory device, combining the first block family and the second block family.

11. The method of claim 10, wherein combining the first block family and the second block family is performed responsive to determining that a number of vacant records in a block family table is below a threshold number.

12. The method of claim 10, wherein the second block family is created immediately after closing the first block family.

13. The method of claim 10, further comprising:
removing a record associated with the second block family from a block family table.

14. A non-transitory computer-readable storage medium comprising instructions that, when executed by a processing device operatively coupled to a memory device, perform operations comprising:
creating a first block family comprising a first set of blocks that have been programmed within at least one of a first specified time window or a first specified temperature window, wherein each block associated with the first block family is associated with a first set of voltage level offsets;
creating a second block family comprising a second set of blocks that have been programmed within at least one of a second specified time window following the first specified time window or a second specified temperature window, wherein each block associated with the second block family is associated with a second set of voltage level offsets; and
responsive to a determining that a threshold criterion is satisfied, combining the first block family and the second block family, wherein determining that the threshold criterion is satisfied comprises determining that a difference in a voltage offset value associated with a die of the first block family and the same die of the second block family is below a voltage difference threshold for all dice of the memory device.

15. The non-transitory computer-readable storage medium of claim 14, wherein determining that the threshold criterion is satisfied further comprises:
determining that a difference in a write temperature value associated with a die of the first block family and the same die of the second block family satisfies a write temperature threshold criterion for all dies of the memory device.

16. The non-transitory computer-readable storage medium of claim 14, wherein determining that the threshold criterion is satisfied further comprises:

determining that write temperature values associated with the first block family and the second block family are within a predetermined temperature range.

17. The non-transitory computer-readable storage medium of claim 14, wherein combining the first block family and the second block family is performed responsive to determining that a number of vacant records in a block family table is below a threshold number.

18. The non-transitory computer-readable storage medium of claim 14, responsive to failing to detect two block families satisfying the threshold criterion, modifying the threshold criterion.

19. The non-transitory computer-readable storage medium of claim 14, wherein the processing device is to further perform operations comprising:
    selecting a most recently created block family among all block families and a second most recently created block family among all block families as combining candidates.

20. The non-transitory computer-readable storage medium of claim 14, wherein the processing device is to further perform operations comprising:
    appending to first block family metadata of the first block family a record of the second set of blocks.

\* \* \* \* \*